United States Patent [19]

Matsumoto et al.

[11] Patent Number: 5,545,576

[45] Date of Patent: Aug. 13, 1996

[54] METHOD FOR MANUFACTURING A THIN FILM TRANSISTOR PANEL

[75] Inventors: Hiroshi Matsumoto, Hachioji; Haruo Wakai, Tokyo; Hiroyasu Joubettou, Hachioji, all of Japan

[73] Assignee: Casio Computer Co., Ltd., Tokyo, Japan

[21] Appl. No.: 425,894

[22] Filed: Apr. 21, 1995

[30] Foreign Application Priority Data

Apr. 28, 1994 [JP] Japan .................................. 6-111881
Apr. 28, 1994 [JP] Japan .................................. 6-111882

[51] Int. Cl.$^6$ .................................................. H01L 21/786
[52] U.S. Cl. .................. 437/41; 437/51; 437/40; 437/913; 148/DIG. 102
[58] Field of Search .................. 437/41 TFI, 40 TFI, 437/51, 913, 911; 148/DIG. 102

[56] References Cited

U.S. PATENT DOCUMENTS

| | | | |
|---|---|---|---|
| 4,790,630 | 12/1988 | Maurice | 437/181 |
| 4,990,460 | 2/1991 | Moriyama | 437/40 TFI |
| 5,270,229 | 12/1993 | Ishihara | 437/40 TFI |

FOREIGN PATENT DOCUMENTS

| | | | |
|---|---|---|---|
| 0360042 | 3/1991 | Japan | 437/41 TFI |
| 0488641 | 3/1992 | Japan | 437/41 TFI |
| 8704565 | 7/1987 | WIPO | 437/40 TFI |

Primary Examiner—Brian E. Hearn
Assistant Examiner—Michael Trinh
Attorney, Agent, or Firm—Frishauf, Holtz, Goodman, Langer & Chick, P.C.

[57] ABSTRACT

A gate electrode, a semiconductor thin film, a channel protecting film and a photoresist are accumulated on the overall surface of a transparent substrate on which a gate electrode and a gate line are formed. Ultraviolet rays are irradiated through the substrate so that the photoresist and the channel protecting film are self-aligned with respect to the gate electrode and the gate line. A mask is formed on the channel protecting film so as to extend in a direction perpendicular to the channel protecting film. The channel protecting film and the semiconductor thin film are etched using the mask. As a result, the semiconductor thin film and the channel protecting film are patterned without positional deviation so as to have the same width W. Therefore, it is possible to reduce the thin film transistor forming region and the number of steps of the manufacturing process.

4 Claims, 11 Drawing Sheets

METHOD FOR MANUFACTURING A THIN FILM TRANSISTOR PANEL

BACKGROUND OF THE INVENTION

1. Field of the Invention

The present invention relates to a thin film transistor panel for use in an active matrix liquid crystal display and a driving circuit for driving a photosensor.

2. Description of the Related Art

FIG. 11A is a plan view showing one of first conventional thin film transistors of a panel for use in an active matrix liquid crystal display and FIG. 11B is a cross-sectional view of the thin film transistor taken along the line 11B—11B in FIG. 11A.

A gate line 2 and a gate electrode 2a, extending from the gate line 2, are formed on a transparent glass substrate 1. The gate line 2 and the gate electrode 2a are covered by a gate insulating film 3. An amorphous silicon layer 4 and a transparent pixel electrode 8 for applying a driving voltage to a liquid crystal are formed on the gate insulating film 3. A central portion of the amorphous silicon layer 4 is covered by a protecting layer 5 formed of an insulating film or metal. A first end of the amorphous silicon layer 4 is connected to a drain electrode 6a extending from a drain line 6 and a second end of the amorphous silicon layer 4 is connected to a source electrode 7. The source electrode 7 is connected to the pixel electrode 8 formed on the gate insulating film. In this structure, that region of the amorphous silicon layer 4, corresponding to the protecting layer 5, functions as a channel region. Since the amorphous silicon layer 4 and the protecting layer 5 have different shapes, different photomasks must be used in etching. For this reason, a great number of steps are required in the manufacturing process, with the result that the manufacturing yield is reduced. In addition, due to positional deviation in mask alignment for forming the amorphous silicon layer 4, a width W' of the protecting layer 5 and the gate electrode 2a must be considerably wider than a width W of the amorphous silicon layer 4 (in general, the width W' is at least 10 micron wider than the width W). The area of the pixel electrode 8 is therefore reduced, resulting in a low opening ratio.

FIGS. 12A and 12B show another conventional art. The structure of this conventional art is different from the above-mentioned first conventional art, only in that the amorphous silicon layer 4 exists in an overall region in which the protecting layer 5 is formed. In other words, the channel region of the amorphous silicon layer 4 has the same width and shape as those of the protecting layer 5. In this structure, when the protecting layer 5 is formed by means of etching, the channel region of the amorphous silicon layer 4 is completely covered. However, since the channel region of the amorphous silicon layer 4 is wide, a gate-source parasitic capacitance $C_{gs}$ is inevitably great. When the gate-source parasitic capacitance $C_{gs}$ is increased, a pixel capacitance maintained between the pixel electrode 8 and a liquid crystal (not shown) is varied, with the result that the display quality is degraded. The number of steps of the manufacturing process and the occupation ratio of the thin film transistor are the same as those in the first conventional art.

SUMMARY OF THE INVENTION

It is accordingly an object of the present invention to provide a thin film transistor panel which can reduce the number of steps in the manufacturing process and the occupation ratio of the thin film transistor.

According to the present invention, there is provided a thin film transistor panel comprising: a substrate; and a plurality of thin film transistors, each having a gate electrode; a gate insulating film; a semiconductor thin film including a source region, a drain region and a channel region having a predetermined width; a source electrode connected to the source region of the semiconductor thin film; a drain electrode connected to the drain region of the semiconductor thin film; and an insulating film formed on the channel region of the semiconductor thin film and having substantially the same width W as that of the channel region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B to 4A and 4B are views for explaining a process for manufacturing a thin film transistor panel according to a first embodiment of the present invention, wherein FIG. 1A is a plan view showing a state in which a channel protecting film is formed on an insulating substrate, FIG. 1B is a cross-sectional view taken along the line 1B—1B in FIG. 1A, FIG. 4A is a plan view showing a state in which a source electrode and a drain electrode are formed, and FIG. 4B is a cross-sectional view taken along the line 4B—4B in FIG. 4A;

FIGS. 5A and 5B to 10A and 10B are views for explaining a process for manufacturing a thin film transistor panel according to a second embodiment of the present invention, wherein FIG. 5A is a plan view showing a state in which a metal layer for forming a metal silicide, is formed on an insulating substrate, FIG. 5B is a cross-sectional view taken along the line 5B—5B in FIG. 5A.

FIG. 9A is a plan view showing a state in which an element region is formed,

FIG. 9B is a cross-sectional view taken along the line 9B—9B in FIG. 9A,

FIG. 10A is a plan view showing a state in which a source electrode and a drain electrode are formed, and FIG. 10B is a cross-sectional view taken along the line 10B—10B in FIG. 10A;

DETAILED DESCRIPTION OF THE PREFERRED EMBODIMENTS

[First Embodiment]

FIGS. 1A and 1B to 4A and 4B show steps for manufacturing a thin film transistor panel according to a first embodiment of the present invention. Each thin film transistor of the present invention and a method for manufacturing the same will be described with reference to these drawings.

Figure 1A:
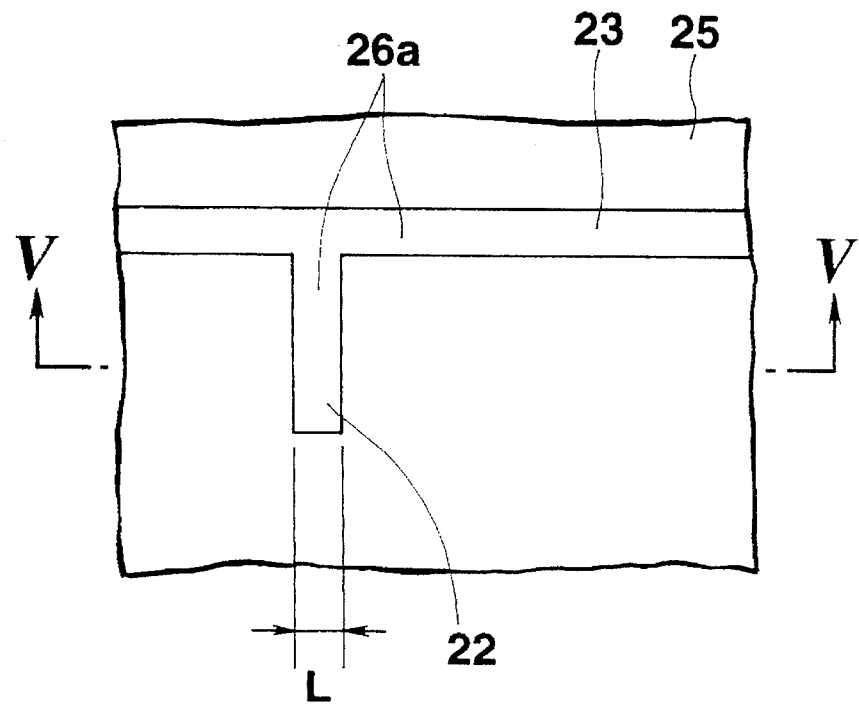
Figure 1B:
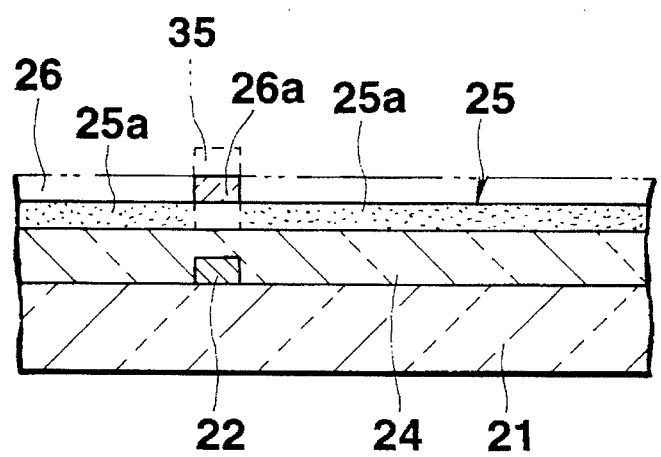

As shown in FIGS. 1A and 1B, a metal film, made of chrome or the like, having a thickness of about 1000 Å (angstrom) is formed on a transparent substrate 21 formed of, for example, glass. A photoresist is applied to the surface of the metal film and thus a gate electrode 22 and a gate line 23 are formed by the conventional photolithography. A gate insulating film 24 made of silicon nitride or the like is formed to a thickness of about 3000 Å on the gate electrode 22, the gate line 23 and the overall exposed portion of the transparent substrate 21. A semiconductor thin film 25, formed of monocrystalline silicon, amorphous silicon, polysilicon or the like, is formed on the gate insulating film 24 to a thickness of about 500 Å. A channel protecting film 26a made of silicon nitride is patterned on a predetermined portion of the semiconductor thin film 25 to a thickness of about 1000 Å. The channel protecting film 26a is self-aligned with the gate electrode 22 and the gate line 23 in the following manner. A metal or insulating film 26 is first formed on the overall surface of the semiconductor thin film 25, as indicated by the two-dots-and-dash line shown in FIG. 1B. Then, a photoresist layer (not shown) is formed on the entire film 26. The photoresist layer is exposed to ultraviolet rays applied from the transparent substrate 21 side, in a direction indicated by the arrows shown in FIG. 1B, using the gate electrode 22 and the gate line 23 as masks. The photoresist layer is then developed, thereby forming a photoresist pattern 35, which is self-aligned with respect to the gate electrode 22 and the gate line 23, as indicated by the dot line in FIG. 1B. Using the photoresist pattern 35 as a mask, the portion of the film 26, which is indicated by the two-dots-and-dash line in FIG. 1B, is etched. As a result, the channel protecting film 26a self-aligned with respect to the gate electrode 22 and the gate line 23 is formed. The channel protecting film 26a is thus formed on the overall region of the gate electrode 22 and the gate line 23. A length L in the channel length direction of the channel protecting film 26a above the gate electrode 22 is the same as the width of the gate electrode 22. Subsequently, the photoresist pattern 35 is removed and ions, such as phosphor or boron, are injected into the semiconductor thin film using the channel protecting film 26a as a mask. As a result, an ion-injected region 25a is formed in the region of the semiconductor thin film except for that portion under the channel protecting film 26a.

Figure 2A:
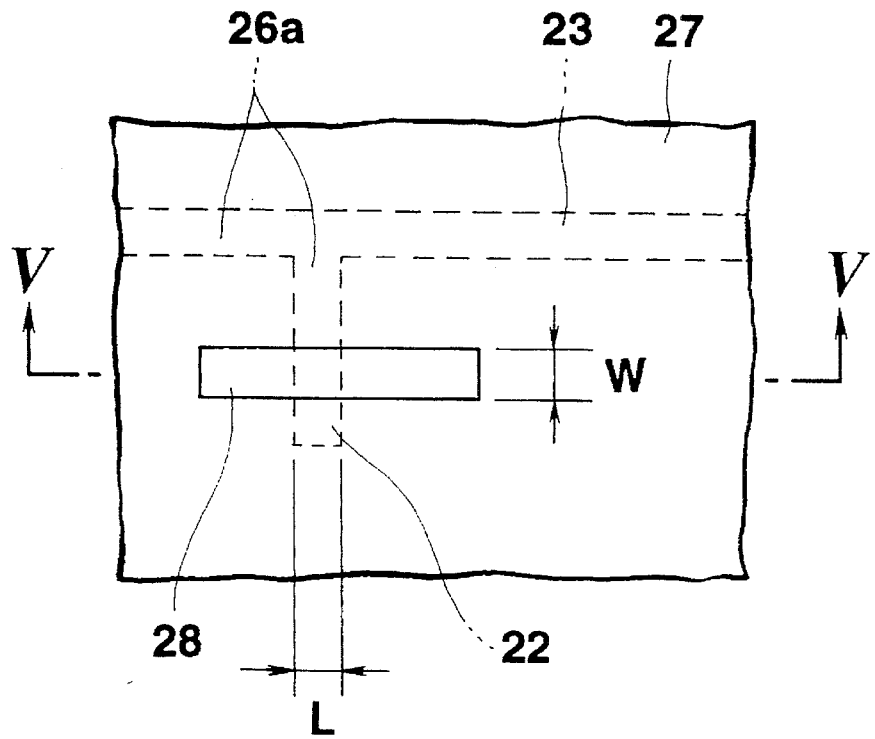
FIG. 2A is a plan view showing a state in which a photoresist mask, to be used in forming an element region, is formed.
Figure 2B:
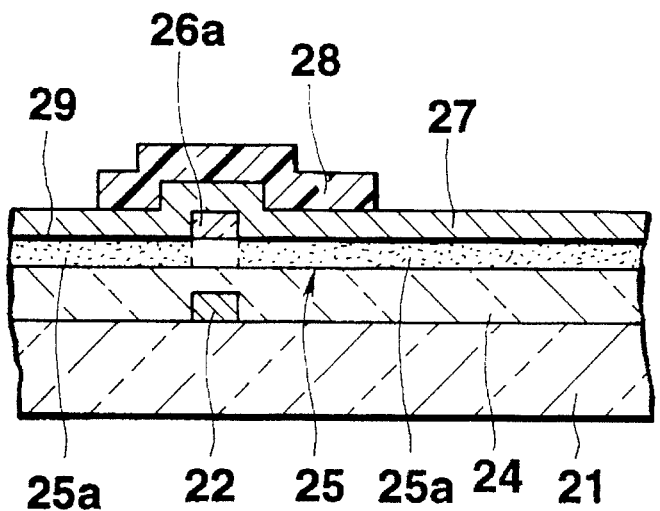
FIG. 2B is a cross-sectional view taken along the line 2B—2B in FIG. 2A.
Figure 3A:
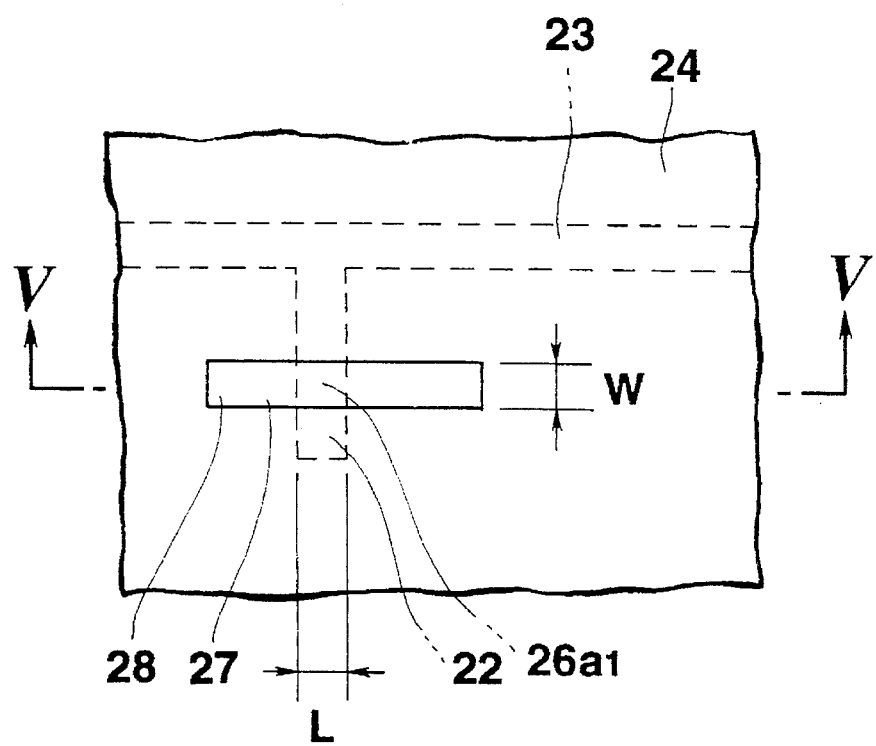
FIG. 3A is a plan view showing a state in which an element region is formed.
Figure 3B:
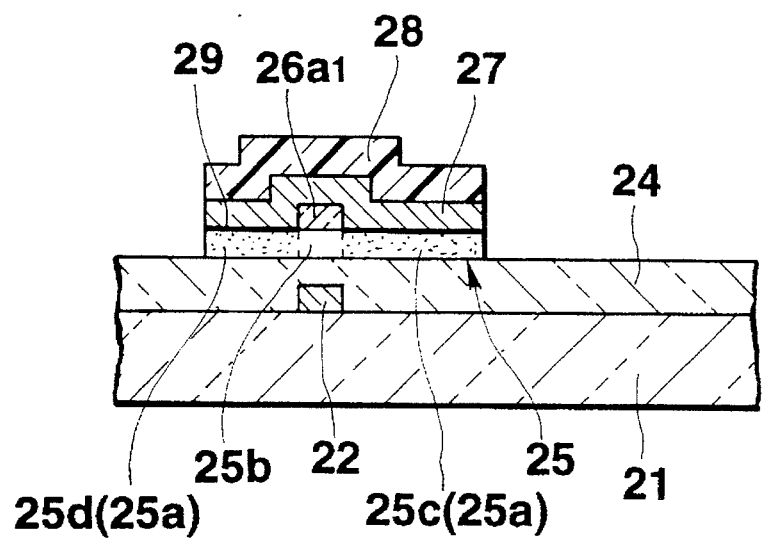
FIG. 3B is a cross-sectional view taken along the line 3B—3B in FIG. 3A.

Then, as shown in FIGS. 2A and 2B, a conductive film 27 made of a metal (e.g., chrome), which can be silicified, is deposited on the overall substrate to a thickness about 250 Å by a plasma CVD process. A photoresist material is formed on the overall conductive film 27 and then patterned into by means of photolithography, thereby forming a photoresist pattern 28 on a predetermined portion of the conductive film 27. The photoresist pattern 28 is formed across the channel protecting film 26a substantially at right angles. A width W of the photoresist pattern 28 is the same as an expected channel width. A silicide layer 29 having a thickness of about several tens of angstroms is formed between the conductive film 27 and the semiconductor thin film region 25a. The conductive film 27, the silicide layer 29, the channel protecting film 26a and the semiconductor thin film region 25a are etched using the photoresist film 28 as a mask. As a result, the structure shown in FIGS. 3A and 3B can be obtained.

In this structure, the conductive film 27 remains only under the resist pattern 28. The silicide layer 29 and a channel protecting film section 26a1 of the film 26a remain only under the conductive film 27. The semiconductor thin film 25 remains only under the channel protecting film section 26a1. Since the conductive film 27, the silicide layer 29, the channel protecting film 26a and the semiconductor thin film 25 are etched using the photoresist pattern 28 as a mask, even if the resolution of the lithography has its limit, no problem will occur for alignment. In the state as described above, although the conductive film 27 is formed across the gate electrode 22 substantially at right angles, the channel protecting film 26a1 is formed above the gate electrode 22 and just under the conductive film 27. In other words, the semiconductor thin film 25 is formed just under the conductive film 27 including the channel protecting film section 26a1. That portion of the semiconductor thin film 25, which is formed under the channel protecting film section 26a1, serves as a channel region 25b of an intrinsic region wherein no impurities are diffused. A source region 25c and a drain region 25d, made of ion-injected region 25a, are formed on both sides of the channel region 25b. The semiconductor thin film 25 thus includes the channel region 25b having the length L, which is the same as the width of the gate electrode 22, and the source and drain regions 25c and 25d having the same width as the width W of the channel region 25b, on both sides of the channel region 25b. The effective channel width is equal to the expected channel width. The photoresist pattern 28 is thereafter removed.

Figure 4A:
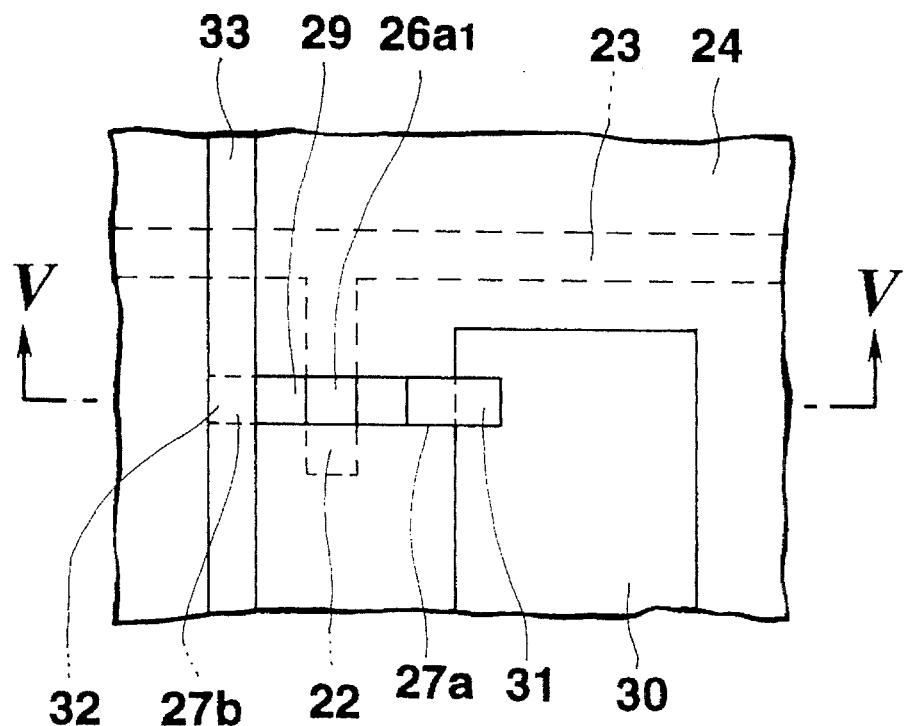
Figure 4B:
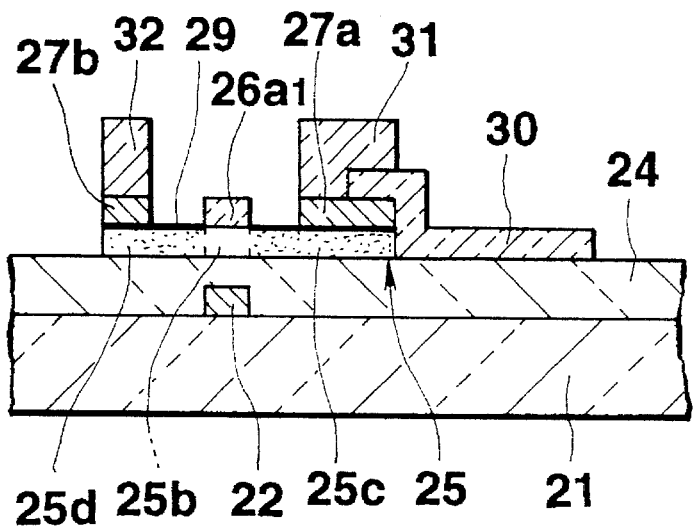

Then, as shown in FIGS. 4A and 4B, a pixel electrode 30 made of ITO is formed on a predetermined portion of the surface of the gate insulating film 24 to a thickness of about 500 Å. A source electrode 31, a drain electrode 32 and a drain line 33 which are made of an aluminum-titanium alloy, are formed on predetermined portions of the surface to a thickness of about 3000 Å. Using the source electrode 31 and the drain electrode 32 as masks, an unnecessary portion of the unsilicified conductive film 27 on and around the channel protecting film section 26a1 is removed by etching. The remaining portion of the conductive film 27 is separated into two, thereby forming a lower source electrode 27a and a lower drain electrode 27b. In this state, the source region 25c of the semiconductor thin film 25 is electrically connected to the pixel electrode 30 through the silicide layer 29, the lower source electrode 27a and the source electrode 31. The drain region 25d is electrically connected to the drain electrode 32 through the silicide layer 29 and the lower drain electrode 27b. In this way, the thin film transistor panel of this embodiment is produced.

With the thin film transistor panel, since the channel width of the semiconductor thin film 25 can be the expected width W, the effective channel width is not increased. Therefore, the gate-source parasitic capacitance $C_{GS}$, the off current $I_{off}$ can be reduced, and the display performance of the liquid crystal display can be improved.

[Second Embodiment]

FIGS. 5A and 5B to 10A and 10B show steps for manufacturing a thin film transistor panel according to a second embodiment of the present invention. A method for manufacturing the thin film transistor of this embodiment will be described with reference to these drawings.

Figure 5A:
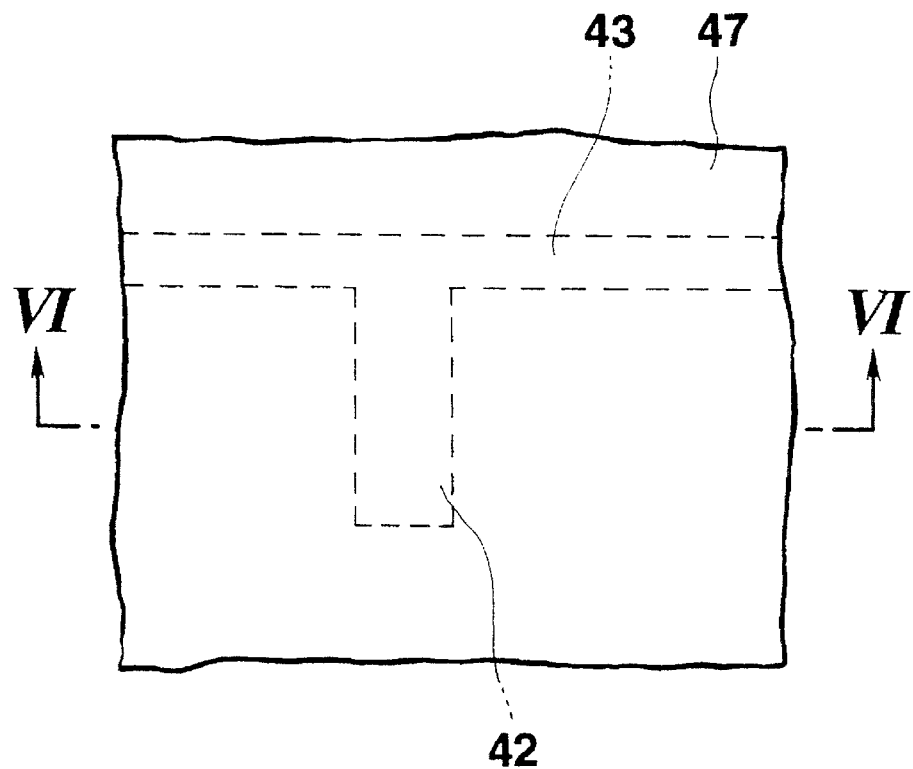
Figure 5B:
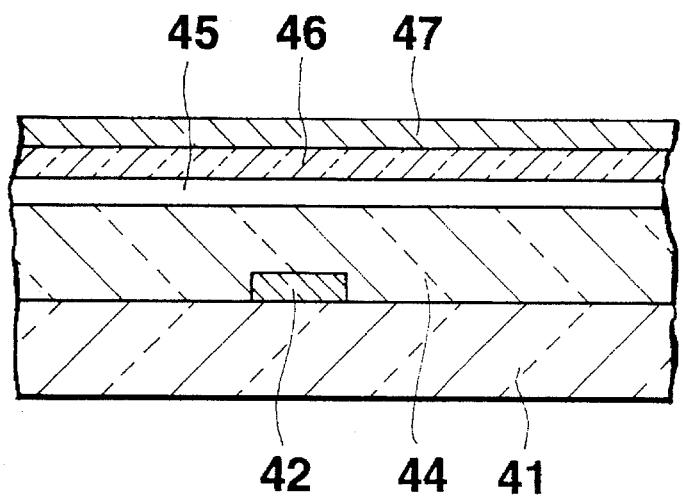

As shown in FIGS. 5A and/or 5B, a gate electrode 42 and a gate line 43 made of chrome or the like, having a thickness of about 1000 Å, are formed on a transparent substrate 41 made of, for example, glass, in the same manner as in the first embodiment. A gate insulating film 44 made of silicon nitride is formed on the gate electrode 42, the gate line 43 and the substrate 41 to a thickness of about 4000 Å. A semiconductor thin film 45, made of monocrystalline silicon, amorphous silicon, polysilicon or the like, is formed on the gate insulating film 44 to a thickness of about 500 Å. The exposed surface of the semiconductor thin film 45 is oxidized by an $O_2$ plasma process or the like, thereby forming an insulating film 46 made of a silicon oxide film. Then, a metal film 47 made of, e.g., chrome, which can form a silicide, is formed on the overall substrate by sputtering.

The insulating film 46 has a thickness which prevents formation of a silicide but allows passage of ions. That is, the thickness is about 100 Å or thinner, preferably, 10 to 50 Å. In this state, formation of a silicide layer between the metal film 47 and the semiconductor thin film 45 is prevented. The metal film 47 is about 50 to 200 Å, i.e., thin enough to allow passage of ions and assure a transmission ratio required to sufficiently expose the photoresist in an exposure from the rear side (to be described later).

Figure 6A:
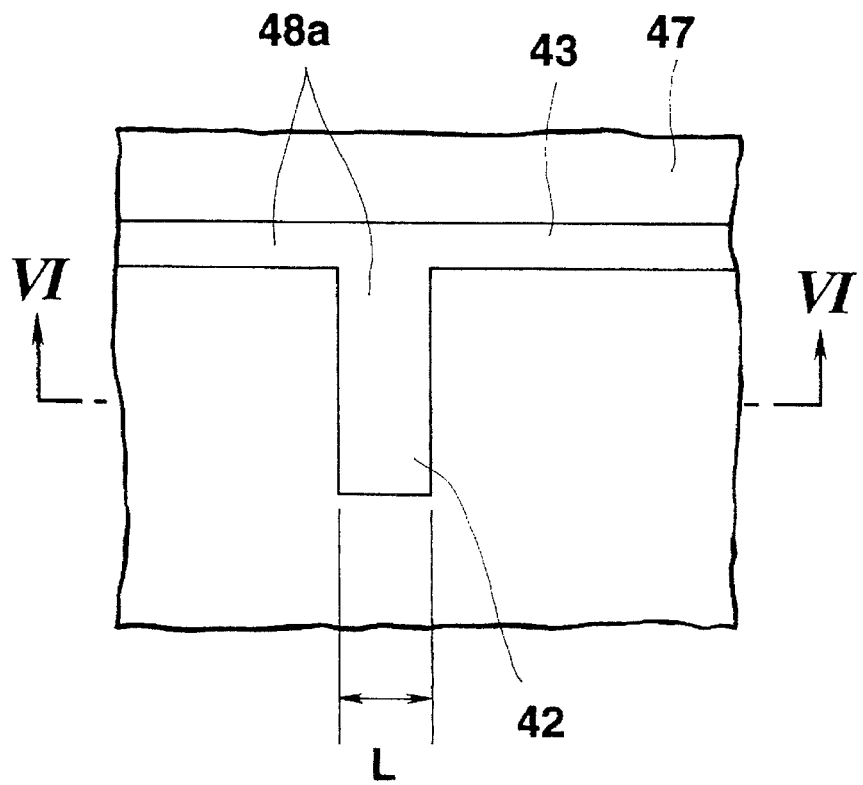
FIG. 6A is a plan view showing a state in which an ion cutoff layer is formed.
Figure 6B:
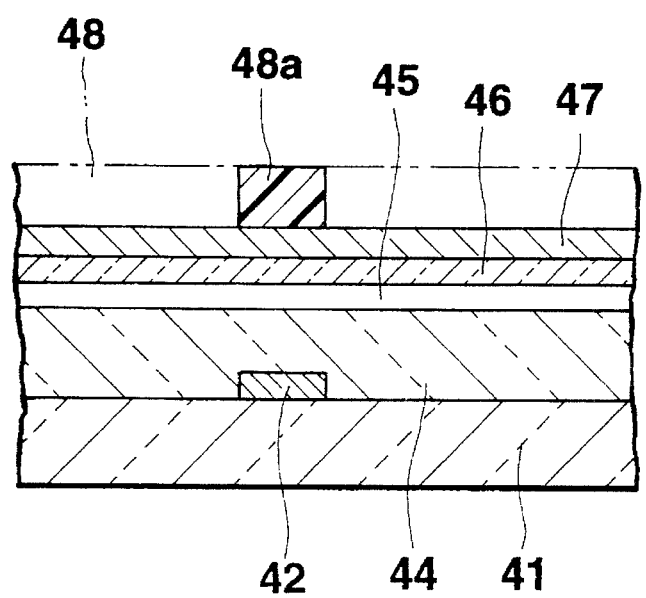
FIG. 6B is a cross-sectional view taken along the line 6B—6B in FIG. 6A.

Subsequently, as shown in FIGS. 6A and 6B, an ion cutoff layer 48a made of a photoresist material is formed on a predetermined portion of the surface of the metal film 47. The ion cutoff layer 48a is self-aligned with the gate electrode 42 and the gate line 43 in the following manner.. An ion cutoff layer 48 is first formed on the overall surface of the metal film 47, as indicated by the two-dots-and-dash line shown in FIG. 6B. The ion cutoff layer 48 is exposed to ultraviolet rays applied through the transparent substrate 41 using the gate electrode 42 and the gate line 43 as masks, and then developed, so that the portion of the ion cutoff layer 48, which is indicated by the two-dots-and-dash line may be etched. As a result, the ion cutoff layer 48a self-aligned with respect to the gate electrode 42 and the gate line 43 is formed. The ion cutoff layer 48a is thus formed on the overall region of the gate electrode 42 and the gate line 43. A length L in the channel length direction of the ion cutoff layer 48a above the gate electrode 42 is the same as the width of the gate electrode 42. In the case where the ion cutoff layer 48a is formed of the photoresist material as described above, since the photoresist material is formed on the metal film 47, unnecessary portions of the photoresist material can easily be removed. Therefore, the ion cutoff layer 48a can be formed in a short period of time by a small number of steps.

Figure 7A:
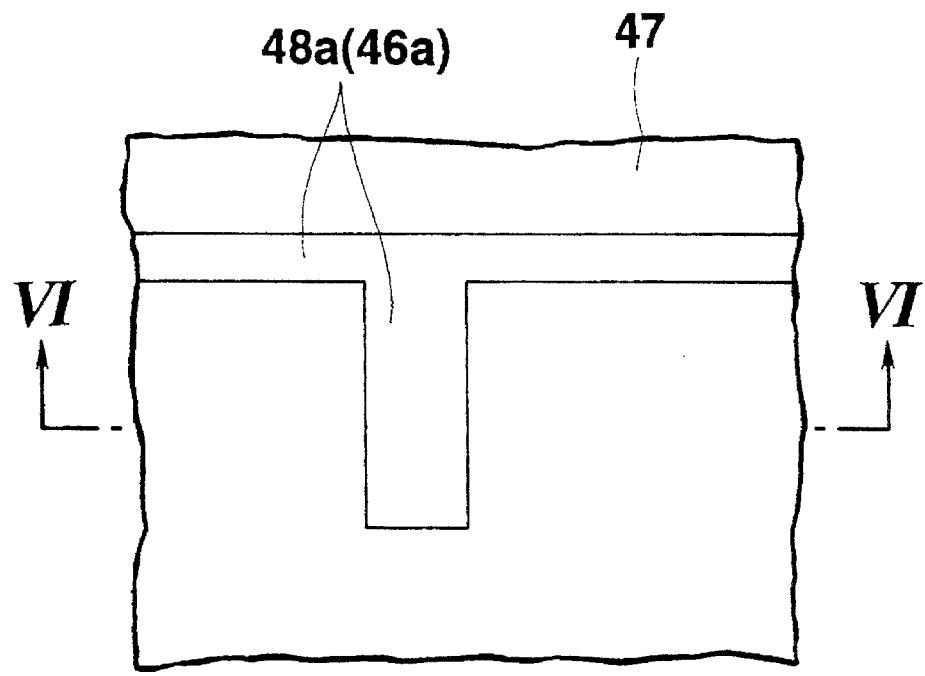
FIG. 7A is a plan view showing a state in which a metal silicide layer is formed on a semiconductor layer.
Figure 7B:
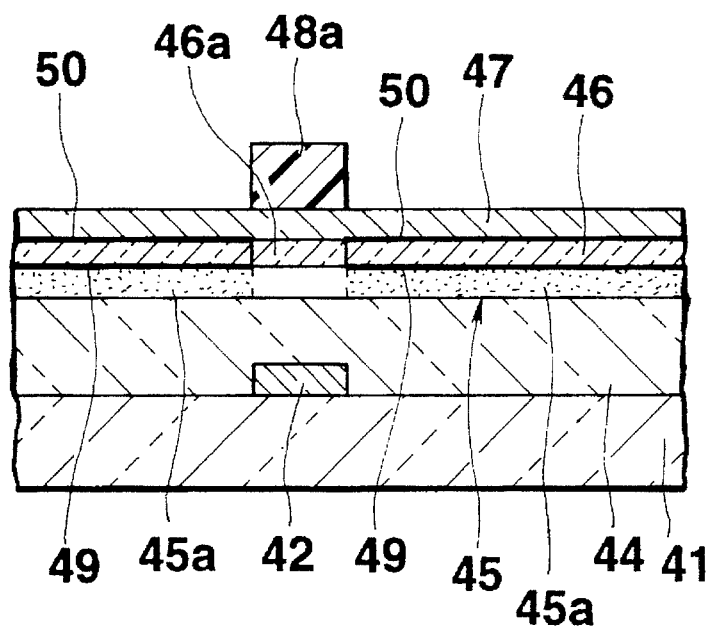
FIG. 7B is a cross-sectional view taken along the line 7B—7B in FIG. 7A.

As shown in FIGS. 7A and 7B, ions containing phosphor or boron ions are implanted into the semiconductor thin film 45 to cause the semiconductor thin film 45 to become an n-type or a p-type. The implanted ions are passed through the metal film 47 and the insulating film 46 and injected into that portion of the semiconductor thin film 45 except for the region just under the ion cutoff layer 48a, with the result that an ion-injected region 45a is formed. By ion implanting energy at this time, metal (chrome) in the metal film 47 is also injected into that portion of the semiconductor thin film 45 except for the region just under the ion cutoff layer 48a through the insulating film 46, with the result that metal silicide layers 49 and 50 are formed on the upper surface of the semiconductor thin film 45 and the lower surface of the metal film 47. In this time, no metal silicide is formed in that portion of the region 46a of the insulating film 46 which corresponds to the ion cutoff layer. After the metal silicide layers have been formed, the ion cutoff layer 48a is removed.

For example, ions consisting of phosphor of 1% and hydrogen of 99% were implanted under the conditions of a power of 100 W, an acceleration voltage of 1 kV and a dose of $1 \times 10^{16}/cm^2$. Thereafter, the ion cutoff layer 48a, the metal film 47, an upper silicide layer 50 and the insulating film 46 were removed. In this state, sheet resistances were measured at a portion where the ion cutoff layer 48a was present and a portion where it was not present. The sheet resistance at the portion where the ion cutoff layer 48a was not present was as small as about 140 Ω/□ or less, while the sheet resistance at the portion where the ion cutoff layer 48a was present was as great as about $10^{10}$ Ω/□ or more. As evident from these results, a lower metal silicide layer 49 having a lower resistance is formed by the ion implanting energy on the semiconductor thin film 45 except for the region just under the ion cutoff layer 48a and the region just under the channel region of the ion cutoff layer 48a has a high resistance.

Figure 8A:
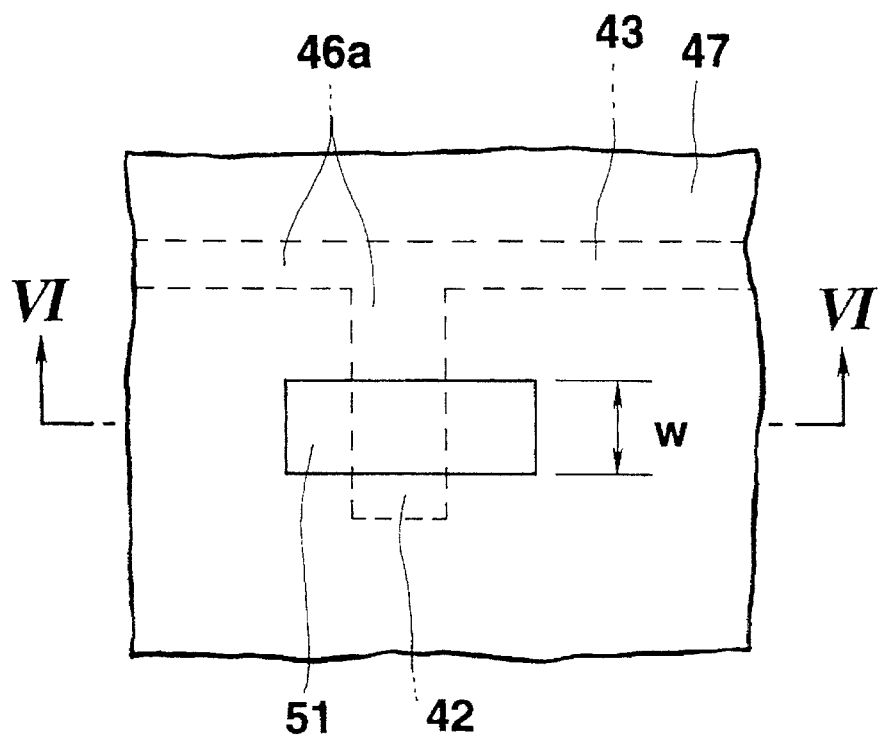
FIG. 8A is a plan view showing a state in which a metal silicide layer is formed on the semiconductor layer.
Figure 8B:
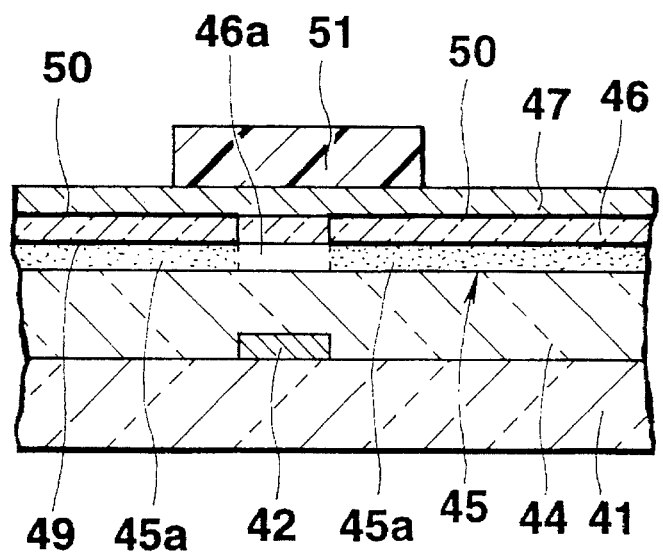
FIG. 8B is a cross-sectional view taken along the line 8B—8B in FIG. 8A.
Figure 9:
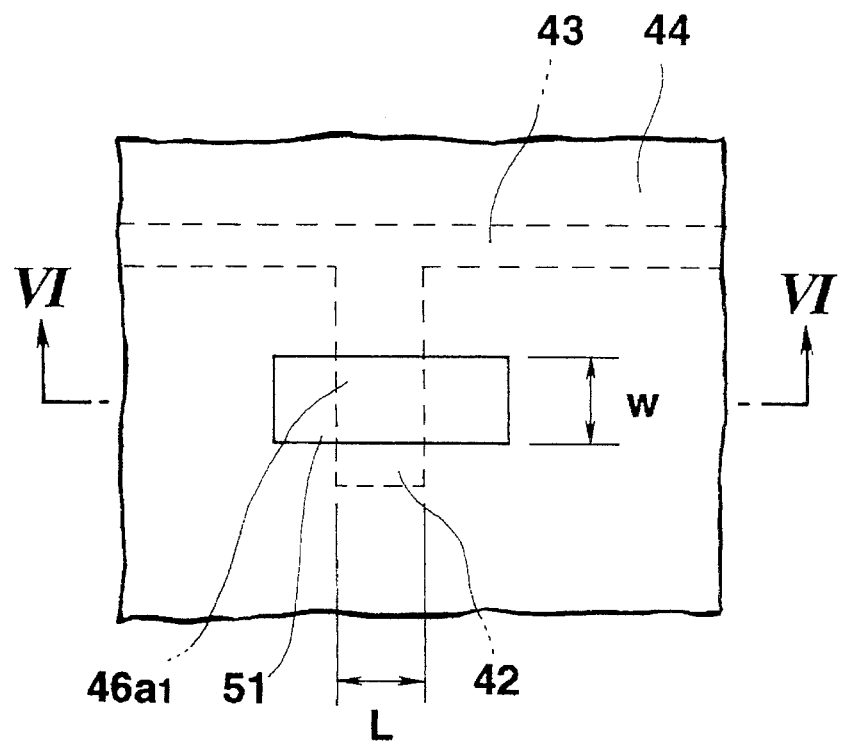
Figure 9:
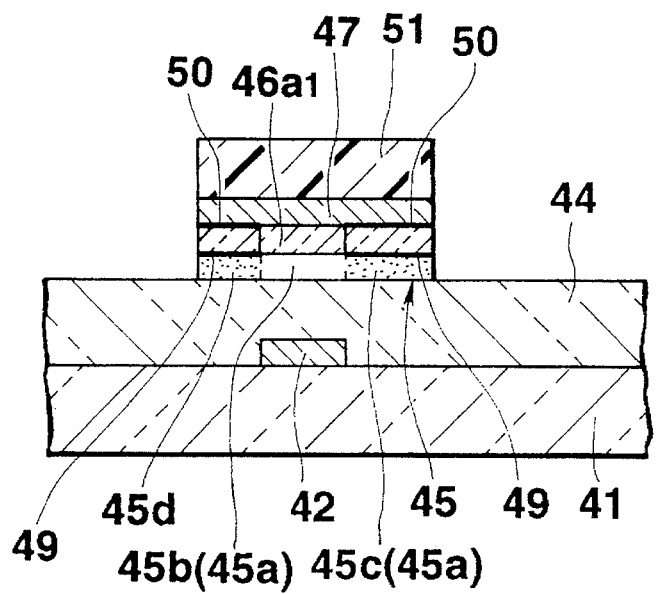
Figure 10:
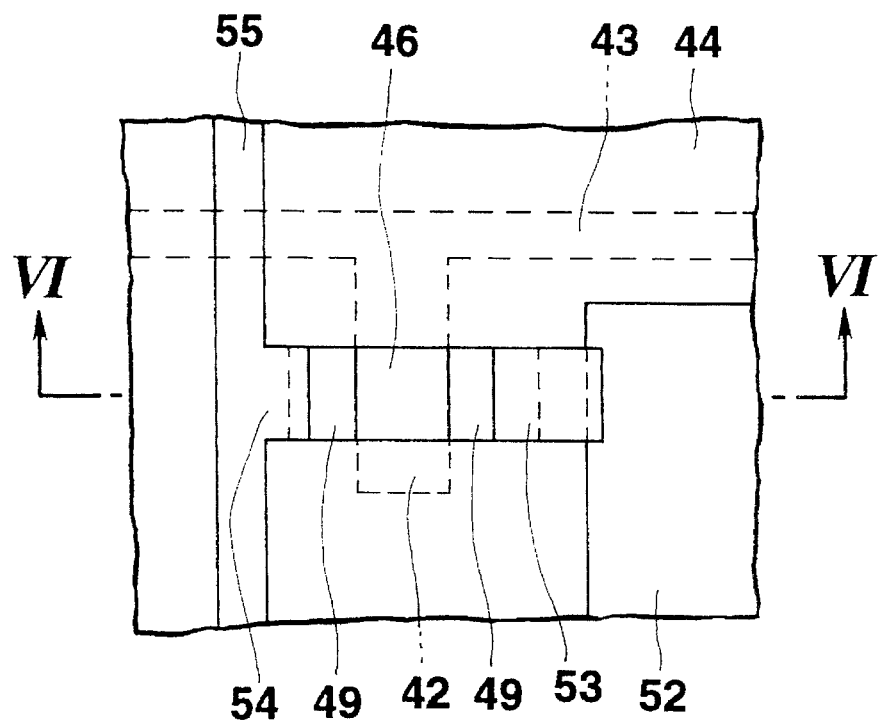
Figure 10:
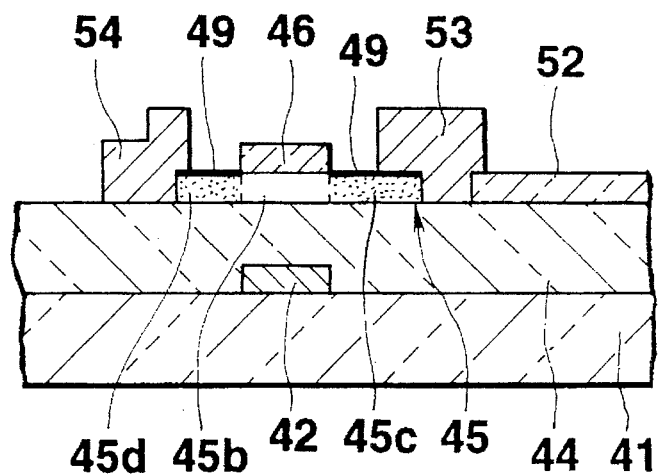
Figure 11A:
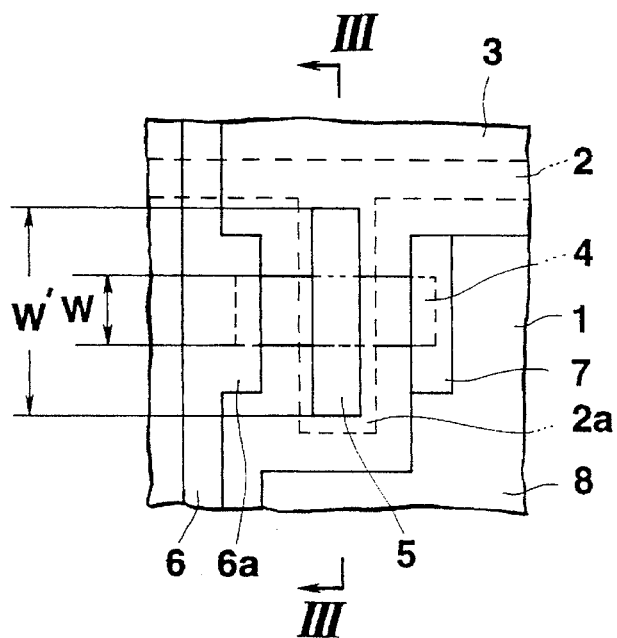
FIG. 11A is a plan view showing first conventional art.
Figure 11B:
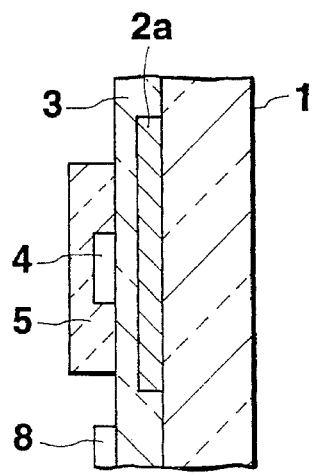
FIG. 11B is a cross-sectional view taken along the line 11B—11B in FIG. 11A.
Figure 12A:
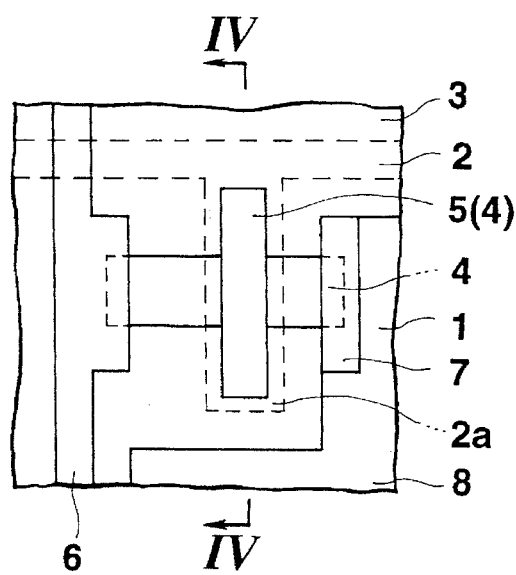
FIG. 12A is a plan view showing second conventional art.
Figure 12B:
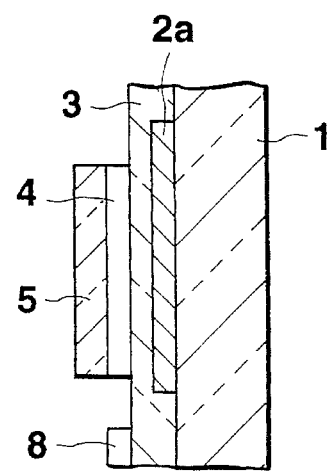
FIG. 12B is a cross-sectional view taken along the line 12B—12B in FIG. 12A.

As shown in FIGS. 8A and 8B, a photoresist pattern 51 is formed on a predetermined portion of the surface of the metal film 47 in the same manner as in the first embodiment. The photoresist pattern 51 is formed across the gate electrode 42 substantially at right angles. A width W of the photoresist pattern 51 is the same as the expected channel width. Using the photoresist pattern 51 as a mask, the metal film 47, the upper silicide layer 50, the insulating film 46, the lower metal silicide film 49 and the semiconductor thin film 25 are selectively etched, thereby forming the structure shown in FIGS. 9A and 9B.

In the structure, the metal film 47, the upper silicide layer 50, the insulating film 46, the lower silicide layer 49 and the semiconductor thin film 45 remain only under the photoresist pattern 51. In this state, the semiconductor thin film 45 extends across the gate electrode 42 substantially at right angles. As regards the insulating layer 46a, only that portion which corresponds to the photoresist pattern 51 remains. That portion of the semiconductor thin film 45, located under the portion of the insulating film 46 in which metal is not injected, serves as a channel region 45b of an intrinsic region. Both side portions of the channel region 45b are formed of ion-injected regions 45a and serve as a source region 45c and a drain region 45d. The semiconductor thin film 45 thus includes the channel region 45b having the length L, which is the same as the width of the gate electrode 42, and the source and drain regions 45c and 45d having the same width as the width W of the channel region 45b, on both sides of the channel region 45b. At this time, an insulating layer section 46a1 also has the same width as the width W of the channel region 45b. Subsequently, the photoresist pattern 51 is removed and thereafter the metal film 47 is also removed. If the metal film 47 is selectively etched with cerium nitrate ammon (SIS, TW solution), the upper silicide layer 50 and the portion of the insulating film 46, in which chrome is injected, can be simultaneously etched and removed (see FIG. 10B).

Thereafter, a pixel electrode 52 made of ITO is formed on a predetermined portion of the surface of the gate insulating film 44 to a thickness of about 500 Å. Then, a source electrode 53, a drain electrode 54 and a drain line 55, made of an aluminum-titanium alloy, are formed on predetermined portions of the surface to a thickness of about 3000 Å. In this state, the source region 45c of the semiconductor thin film 45 is elecrically connected to the pixel electrode 52 through the silicide layer 49 and the source electrode 53, and the drain region 45d is electrically connected to the drain electrode 54. In this way, the thin film transistor of this embodiment is produced.

In the process of this embodiment, although the insulating film 46 is formed between the semiconductor thin film 45 and the metal film 47, it is possible to form the silicide layer 49 by means of ion implanting energy on the surface of the semiconductor thin film 45 except for the region under the ion cutoff layer 48a. For this reason, since a surface treatment need not be performed before formation of the metal film 47, the number of steps can be reduced accordingly. Further, although the ion cutoff layer 48a is made of photoresist, as described before, it is possible to easily remove an unnecessary portion of the photoresist, since the photoresist layer is formed on the metal film 47. Hence, the ion cutoff layer 48a can be formed in a short period of time by a small number of steps. In addition, since the metal film 47 is as thin as 50 to 200 Å and the insulating film 46 is as thin as 10 to 50 Å, it is possible to improve the etching accuracy (the working accuracy) of the insulating film 46, which remains in the state as shown in FIGS. 10A and 10B, with respect to the gate electrode 42.

In addition, in the process according to the above embodiment, since the ion cutoff layer 48a is formed of photoresist, the following advantages over the conventional art can be obtained. First, according to the conventional art, since a silicon nitride layer, to be an ion cutoff layer, is formed by the CVD process to a relatively great thickness of about 2000 Å, a considerable amount of the film forming material adheres to an inner surface of a CVD apparatus. Therefore, it takes a lot of time to clean the inner surface of the CVD apparatus. The method of this embodiment does not have such a drawback. Secondly, according to the conventional art, when the ion cutoff layer made of silicon nitride is patterned, etching is performed by using hydrofluoric acid. The gate insulating film is therefore considerably damaged by the hydrofluoric acid, with the result that the breakdown voltage of the gate insulating film is reduced. The method of this embodiment does not have this drawback.

Further, the semiconductor thin film 45 of the thin film transistor obtained by the method of this embodiment includes the channel region 45b having the length L the same as the width of the gate electrode 42, and the source and drain regions 45c and 45d formed on both sides of the channel region 45b and having the same width as the width W of the channel region 45b. Since the width W of the channel region 45b is an expected width, the capacitance $C_{GS}$ between the gate electrode and the source electrode and the off current $I_{off}$ can be reduced without increasing the effective channel width. Accordingly, the display characteristics of the liquid crystal display can be improved.

In the above embodiment, the insulating film 46 is made of a silicon oxide film formed by oxidizing the surface of the semiconductor thin film 45. However, the insulating film can be formed of a silicon nitride layer deposited on the semiconductor thin film 45 by means of the CVD process. In this case, the thickness of the silicon nitride film is preferably several tens to several hundreds angstroms, particularly preferably, about 100 Å. When the silicon nitride layer is thus thin, it can be formed in a short period of time, and the time and labor required for cleaning the inner surface of the CVD apparatus can be reduced. Even if etching is performed by using hydrofluoric acid to pattern the ion cutoff layer made of silicon nitride, the etching time can be shortened. Therefore, the gate insulating film is damaged less, with the result that the breakdown voltage of the gate insulating film can be increased. Further, it is possible to use natural oxide film formed on the surface of the semiconductor thin film 45, without performing an oxidization process.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a thin film transistor panel comprising:

a first step of forming a gate electrode and a gate line on a transparent insulating substrate;

a second step of successively forming a gate insulating film, a semiconductor thin film and an insulating film on the gate electrode, the gate line and the transparent insulating substrate;

a third step of patterning the insulating film into a shape which is self-aligned with the gate electrode and the gate line by means of exposure through the transparent substrate;

a fourth step of forming, on the insulating film, a mask having a length which extends across the gate electrode at right angles;

a fifth step of etching at least the insulating film and the semiconductor thin film using the mask; and a sixth step of removing the mask, thereby forming a source electrode and a drain electrode.

2. The method according to claim 1, wherein the fourth step includes a step of forming a metal conductive film, which can form a silicide, on the insulating film and the semiconductor thin film, and a step of forming the mask on the metal conductive film.

3. The method according to claim 2, wherein the fourth step includes a step of forming a metal silicide on a surface of the semiconductor thin film from the metal conductive film.

4. The method according to claim 1, wherein the third step includes a step of diffusing an ion impurity into the semiconductor thin film using the insulating film as a mask.

* * * * *

UNITED STATES PATENT AND TRADEMARK OFFICE
CERTIFICATE OF CORRECTION

PATENT NO. : 5,545,576

DATED : August 13, 1996

INVENTOR(S) : Matsumoto et al.

It is certified that error appears in the above-identified patent and that said Letters Patent is hereby corrected as shown below:

The title page, should be deleted and substituted with the attached title page, showing the illustrative figures. In the drawings, figures 1A-12B (Prior Art), should be deleted and substitute therefor Figs. 1A-12B (Prior Art), as shown on the attached pages

United States Patent [19]

Matsumoto et al.

[11] Patent Number: 5,545,576
[45] Date of Patent: Aug. 13, 1996

[54] METHOD FOR MANUFACTURING A THIN FILM TRANSISTOR PANEL

[75] Inventors: Hiroshi Matsumoto, Hachioji; Haruo Wakai, Tokyo; Hiroyasu Joubettou, Hachioji, all of Japan

[73] Assignee: Casio Computer Co., Ltd., Tokyo, Japan

[21] Appl. No.: 425,894

[22] Filed: Apr. 21, 1995

[30] Foreign Application Priority Data

Apr. 28, 1994 [JP] Japan ............................. 6-111881
Apr. 28, 1994 [JP] Japan ............................. 6-111882

[51] Int. Cl.⁶ ................................................ H01L 21/786
[52] U.S. Cl. ....................... 437/41; 437/51; 437/40; 437/913; 148/DIG. 102
[58] Field of Search ................. 437/41 TFI, 40 TFI, 437/51, 913, 911; 148/DIG. 102

[56] References Cited

U.S. PATENT DOCUMENTS 4,790,630  12/1988  Maurice ............................. 437/181
4,990,460  2/1991   Moriyama ......................... 437/40 TFI
5,270,229  12/1993  Ishihara ............................ 437/40 TFI

FOREIGN PATENT DOCUMENTS 0360042  3/1991  Japan .............................. 437/41 TFI
0488641  3/1992  Japan .............................. 437/41 TFI
8704565  7/1987  WIPO .............................. 437/40 TFI Primary Examiner—Brian E. Hearn
Assistant Examiner—Michael Trinh
Attorney, Agent, or Firm—Frishauf, Holtz, Goodman, Langer & Chick, P.C.

[57] ABSTRACT

A gate electrode, a semiconductor thin film, a channel protecting film and a photoresist are accumulated on the overall surface of a transparent substrate on which a gate electrode and a gate line are formed. Ultraviolet rays are irradiated through the substrate so that the photoresist and the channel protecting film are self-aligned with respect to the gate electrode and the gate line. A mask is formed on the channel protecting film so as to extend in a direction perpendicular to the channel protecting film. The channel protecting film and the semiconductor thin film are etched using the mask. As a result, the semiconductor thin film and the channel protecting film are patterned without positional deviation so as to have the same width W. Therefore, it is possible to reduce the thin film transistor forming region and the number of steps of the manufacturing process.

4 Claims, 11 Drawing Sheets

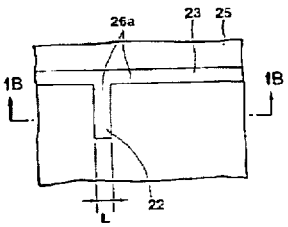

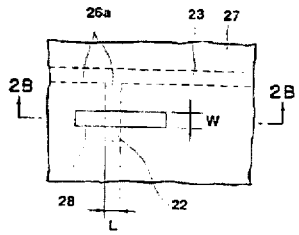

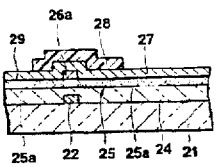

UNITED STATES PATENT AND TRADEMARK OFFICE
CERTIFICATE OF CORRECTION

PATENT NO. : 5,545,576  
DATED : August 13, 1996  
INVENTOR(S) : Matsumoto et al Page 3 of 13

It is certified that error appears in the above-identified patent and that said Letters Patent is hereby corrected as shown below:

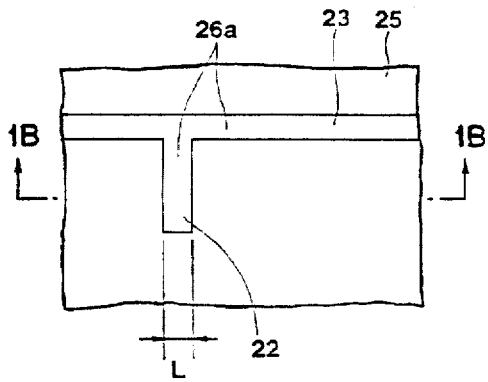

FIG.1A

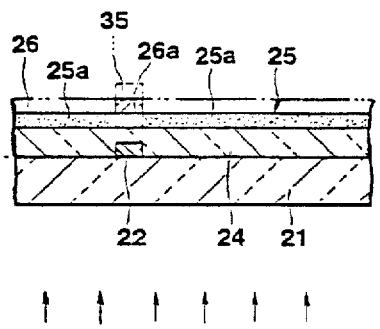

FIG.1B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

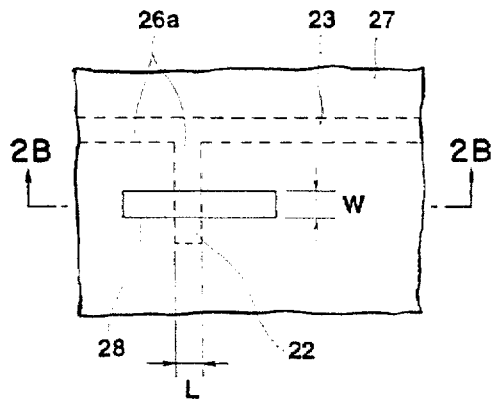

FIG.2A

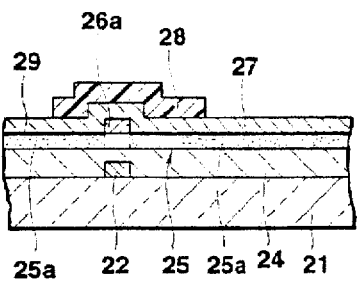

FIG.2B

UNITED STATES PATENT AND TRADEMARK OFFICE
CERTIFICATE OF CORRECTION

PATENT NO. : 5,545,576  
DATED : August 13, 1996  
INVENTOR(S) : Matsumoto et al Page 5 of 13

It is certified that error appears in the above-identified patent and that said Letters Patent is hereby corrected as shown below:

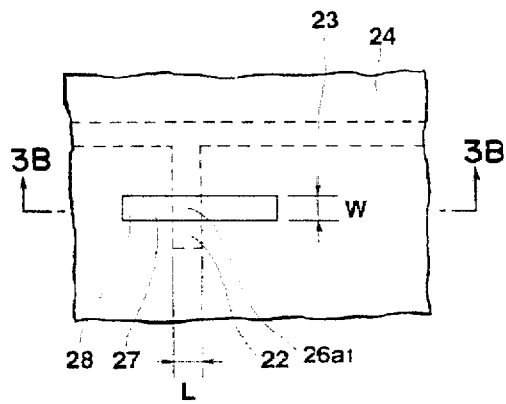

FIG. 3A

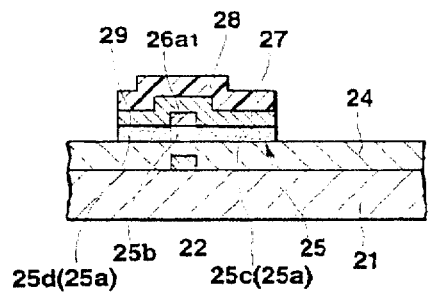

FIG. 3B

UNITED STATES PATENT AND TRADEMARK OFFICE
CERTIFICATE OF CORRECTION

PATENT NO.   : 5,545,576
DATED        : August 13, 1996
INVENTOR(S)  : Matsumoto et al Page 6 of 13

It is certified that error appears in the above-identified patent and that said Letters Patent is hereby corrected as shown below:

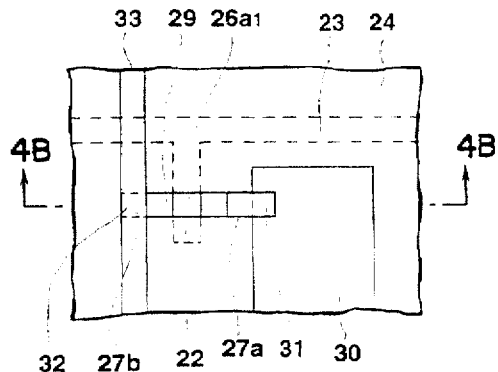

FIG.4A

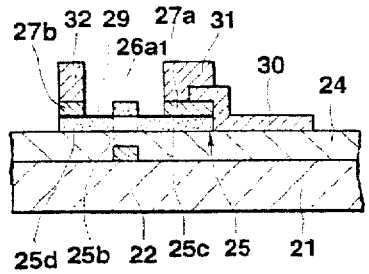

FIG.4B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

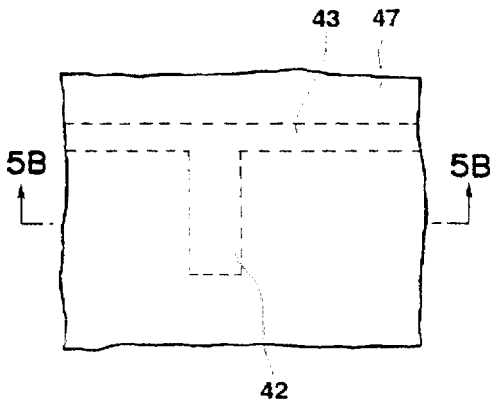

FIG.5A

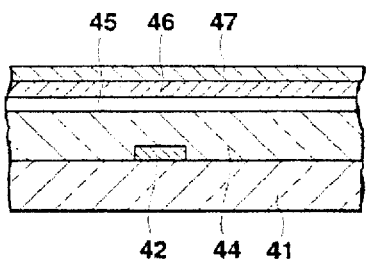

FIG.5B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

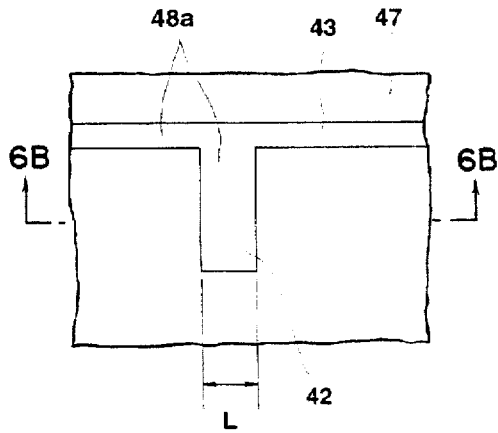

FIG.6A

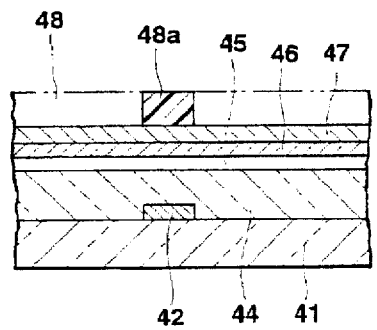

FIG.6B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

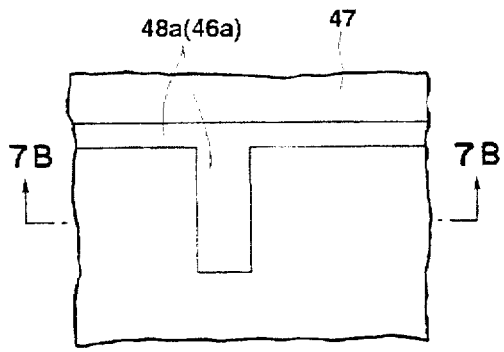

FIG.7A

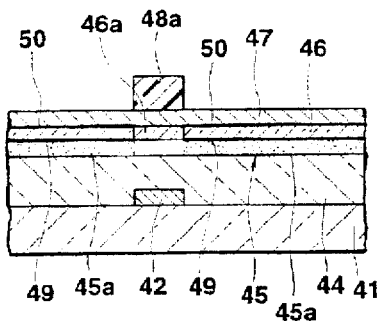

FIG.7B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

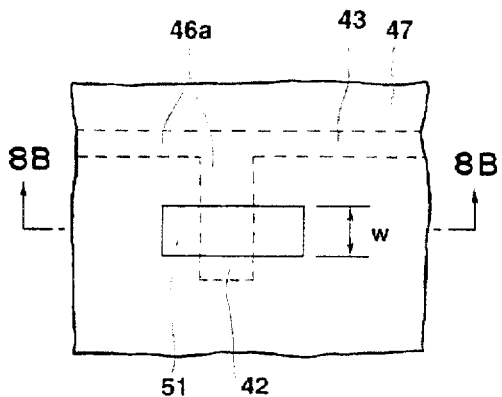

FIG. 8A

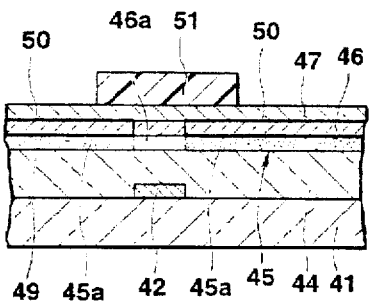

FIG. 8B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

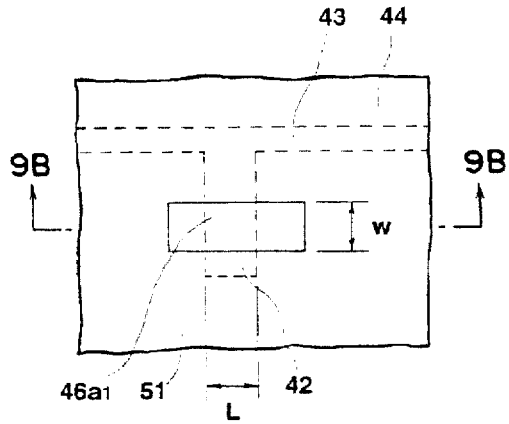

FIG. 9A

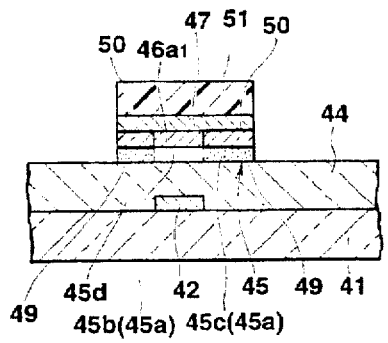

FIG. 9B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

It is certified that error appears in the above-identified patent and that said Letters Patent is hereby corrected as shown below:

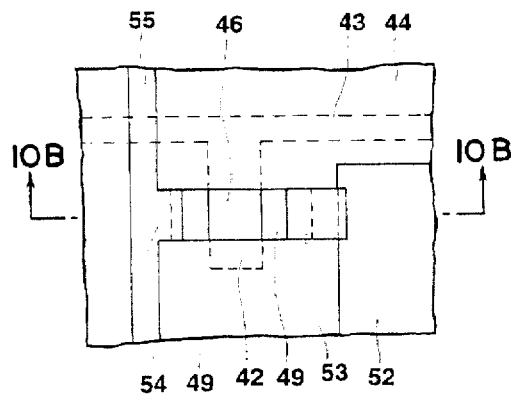

FIG.10A

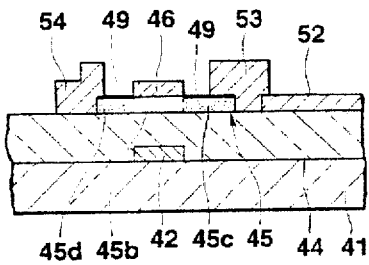

FIG.10B

UNITED STATES PATENT AND TRADEMARK OFFICE
CERTIFICATE OF CORRECTION

PATENT NO. : 5,545,576
DATED : August 13, 1996
INVENTOR(S) : Matsumoto et al

Page 13 of 13

It is certified that error appears in the above-identified patent and that said Letters Patent is hereby corrected as shown below:

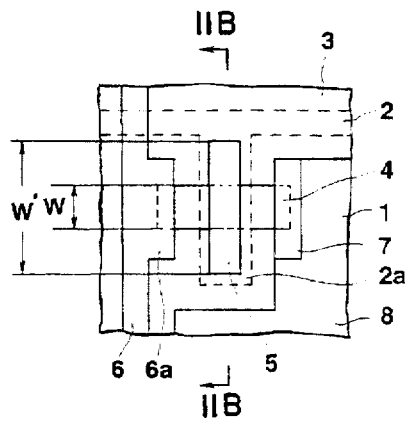

FIG.11A
(PRIOR ART)

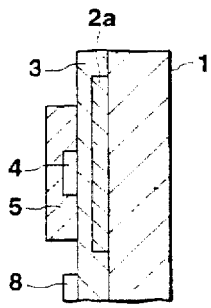

FIG.11B
(PRIOR ART)

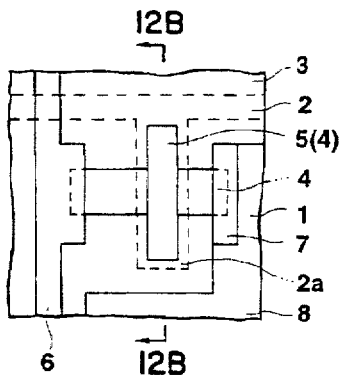

FIG.12A
(PRIOR ART)

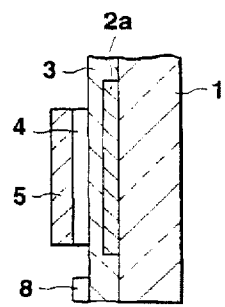

FIG.12B
(PRIOR ART)